United States Patent [19]
Liu et al.

[11] Patent Number: 6,109,915
[45] Date of Patent: Aug. 29, 2000

[54] DRAFTING APPARATUS

[75] Inventors: Tien-Jui Liu, Taichung Hsien; Eric Chu, Hsinchu; Tony Chen, Chia-yi Hsiang, all of Taiwan

[73] Assignee: United Microelectronics Corp., Hsinchu, Taiwan

[21] Appl. No.: 09/208,281

[22] Filed: Dec. 8, 1998

[51] Int. Cl.[7] .................................................. F27D 5/00
[52] U.S. Cl. ........................ 432/253; 118/724; 438/795; 438/935
[58] Field of Search .................................. 432/239, 241, 432/253, 254.1, 254.2, 258; 118/724, 725; 438/935, 308, 795; 219/209, 390

[56] References Cited

U.S. PATENT DOCUMENTS

| | | | |
|---|---|---|---|
| 5,106,453 | 4/1992 | Benko et al. | 156/613 |
| 5,212,116 | 5/1993 | Yu | 437/228 |
| 5,248,253 | 9/1993 | Philipossian et al. | 432/253 |
| 5,647,945 | 7/1997 | Matsuse et al. | 156/345 |

*Primary Examiner*—Denise L. Ferensic
*Assistant Examiner*—Gregory A. Wilson
*Attorney, Agent, or Firm*—Thomas, Kayden, Horstemeyer & Risley

[57] ABSTRACT

A drafting apparatus in a furnace. A buffer board having a plurality of gas intakes is disposed in a front end of the drafting apparatus. A laminar flow board having a plurality of gas outtakes is disposed in a rear end of the drafting apparatus. A drafting region is enclosed by the drafting apparatus. The drafting region comprises at least one drafting board to draft and redirect the gas flow. A laminar flow is then obtained to flow through the outtakes on the laminar board.

11 Claims, 2 Drawing Sheets

DRAFTING APPARATUS

BACKGROUND OF THE INVENTION

1. Field of the Invention

The invention relates to a drafting apparatus, and more particularly, to a drafting apparatus disposed in a furnace to isolate and reduce the burning region.

2. Description of the Related Art

Thermal process is a very important technique in semiconductor fabrication such as annealing, thermal oxidation, and thermal diffusion. Currently, thermal fabrication equipment is categorized into a horizontal type and a vertical type. The operating theory of both types is similar. The following description is thus taking the horizontal type as a example to introduce.

In FIG. 1A, a top view of a horizontal type thermal furnace is shown. The thermal furnace comprises an annealed quartz tube 110, a 3-zone heating element 120 to heat the quartz tube 110 to a certain temperature, and an air injector 130 to inject air or gas into the quartz tube 110 to be heated. The 3-zone heating element 120 is a heater to heat a front end, a middle part, and a rear end of the quartz tube 110, respectively, so as to adjust the heat distribution of the quartz tube 110. A number of wafers 102, for example, about 100 to 150 wafers, is disposed on an annealed quartz wafer boat 106 to be placed into the quartz tube 110. By the heat provided by the 3-zone heating element, the quartz tub 110 is heated to a required temperature.

In a wet oxidation process, hydrogen ($H_2$) and oxygen ($O_2$) flow through two different intakes to the injector 130. Hydrogen and oxygen mix with each other and are injected into the quartz tube 110 by the injector 130. While igniting the mixture of hydrogen and oxygen, highly purified water steam is obtained to perform a wet oxidation process on the wafers 102. The amount of hydrogen is adjustable to avoid that while the oxygen is consumed, the remaining hydrogen causes an explosion in the furnace.

FIG. 1B schematically illustrates the injector 130. Using an axis 100 as a reference, the injector 130 has a tilt angle $\theta_1$ for gas injection. Typically, the tilt angle $\theta_1$ is no more than 10°. While hydrogen is ignited, a high temperature oxy-hydrogen flame 132 and water steam are produced as shown in the figure.

As shown in FIG. 1C, to avoid the wafers carried aside on the wafer boat having a heat energy different from that of the wafers carried amid on the wafer boat 106, dummy wafers 104 are disposed aside on the wafer boat 106 instead of wafer products, while wafers 102 are disposed enclosed by the dummy wafers 104. Therefore, the heat energy is evenly and uniformly distributed to each wafer on the wafer boat 102. The number of the dummy wafers 104 is typically between 6 to 10 as specifically required.

In the above mentioned furnace, the effective region of the oxy-hydrogen flame 132 is long. In order to provide a substantially equal temperature to each wafer, the wafer boat has to be disposed in a long distance away from the oxy-hydrogen flame 132, so that the temperatures of front end and the rear end of the wafer boat are substantially the same. In this manner, a large space is required. The amount of wafers to be carried in the wafer boat is limited to seriously affect the throughput of products.

However, the internal furnace temperature is difficult to control at all points, due to the long, effective region of the oxy-hydrogen flame 132. The front end of the quartz tube 110 has a temperature very much different from the temperature of the rear end of the quartz tube 110. As a consequence, the uniformity between wafers is reduced and disadvantageous to the subsequent fabrication process.

In addition, the effective region of the oxy-hydrogen flame 132 is not isolated from the wafers. The high temperature water steam is reacted with the wafers without being drafted. Thus, the reaction regions above the wafers are not uniform to affect the quality of the thermal process.

To solve the problem, an external ignition apparatus is developed. While the external ignition apparatus ignites, a high temperature wafer steam is lead into the quartz tube 110. However, since the ignition apparatus is disposed externally, once the hydrogen explodes, the operators are directly in danger. In addition, while cleaning the furnace, the external ignition apparatus has to be detached first and installed after the cleaning process. The above-described procedures are both time and labor consuming. Thus, it is not very applicable in terms of safety and efficiency.

In summary, the disadvantages of the conventional thermal process comprises:

1. The utility space is highly reduced to reduce the throughput of products, so that the fabrication cost is increased.

2. The uniformity of the heat region above the wafers is compromised, due to the long expanse of the oxy-hydrogen flame.

3. Alternatively, an external ignition apparatus is used to replace the oxy-hydrogen flaming system. The external ignition apparatus causes a great problem in safety for operators. Furthermore, the efficiency is poor.

4. The water steam flows in random direction, so that the reaction regions above the wafers are non-uniform to cause a quality problem of thermal process.

SUMMARY OF THE INVENTION

It is an object of the invention to provide a drafting apparatus in a furnace to replace the conventional arrangement of dummy wafers. The utility space is effectively reduced, the throughput is enhanced. The furnace is thus more competitive in commerce. As used herein, the term "Drafting Apparatus" should be construed to mean "air flow apparatus". In this regard, a "Drafting Apparatus" is merely a device that operates to alter or redirect the airflow in a space (e.g., a furnace).

It is another object of the invention to provide a drafting apparatus within a furnace to reduce the possibility of endangering human beings while operating.

It is yet another object of the invention to provide a drafting apparatus in a furnace. The water steam is drafted into a uniform flow, so that the reaction regions above the wafers are uniform to improve the quality of thermal process. To achieve these objects and advantages, and in accordance with the purpose of the invention, as embodied and broadly described herein, the invention is directed towards a drafting apparatus in a furnace. A buffer board having a plurality of gas intakes is disposed in a front end of the drafting apparatus. A laminar flow board having a plurality of gas outtakes is disposed in a rear end of the drafting apparatus. A drafting region is enclosed by the drafting apparatus. The drafting region comprises at least one drafting board to draft and redirect the gas flow. A laminar flow is then obtained to flow through the outtakes on the laminar board.

The invention further provide a furnace for performing a thermal treatment. The furnace comprises a drafting apparatus as described above. Therefore, the furnace can be designed with a reduced dimension. The wafer boat can carry more wafers to perform the thermal treatment than the conventional furnace.

It is to be understood that both the foregoing general description and the following detailed description are exemplary and explanatory only and are not restrictive of the invention, as claimed.

DESCRIPTION OF THE PREFERRED EMBODIMENTS

Figure 2A:
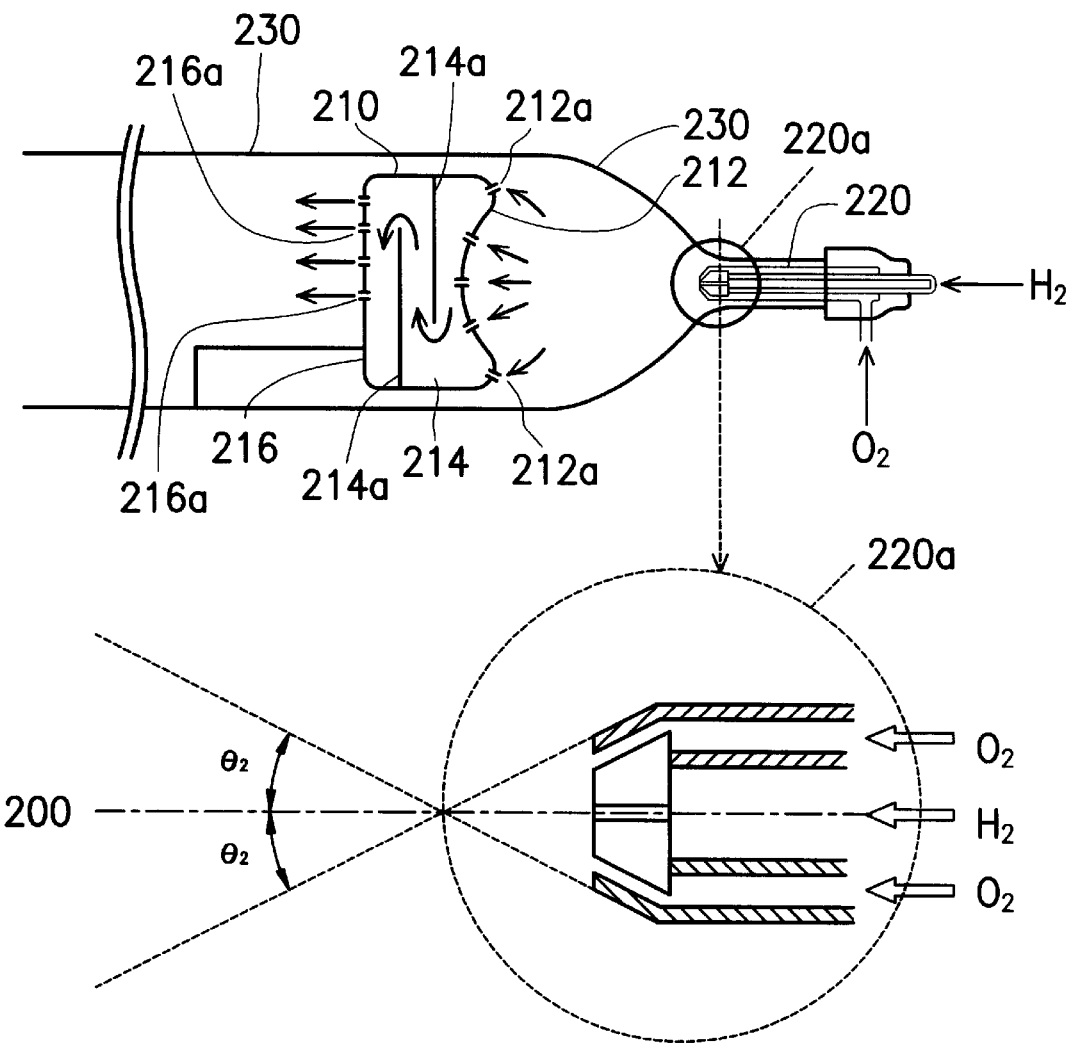
FIG. 2A is a side view showing a drafting apparatus of a furnace in a preferred embodiment according the invention.

In FIG. 2A, a side view showing a drafting apparatus of a furnace in a preferred embodiment according the invention is shown. A drafting apparatus 210 is installed in a first end of a furnace 230. A wide angle gas injector 220a inject a mixture of gases into the furnace 230. While performing a wet process, the wide angle gas injector 220 inject a mixture with hydrogen to the furnace 230. The hydrogen contained in the mixture of gas ignites to produce an oxy-hydrogen flame and a high temperature water steam. Using the high temperature water, a wet oxidation is performed on wafers disposed in the furnace 230.

Figure 1A:
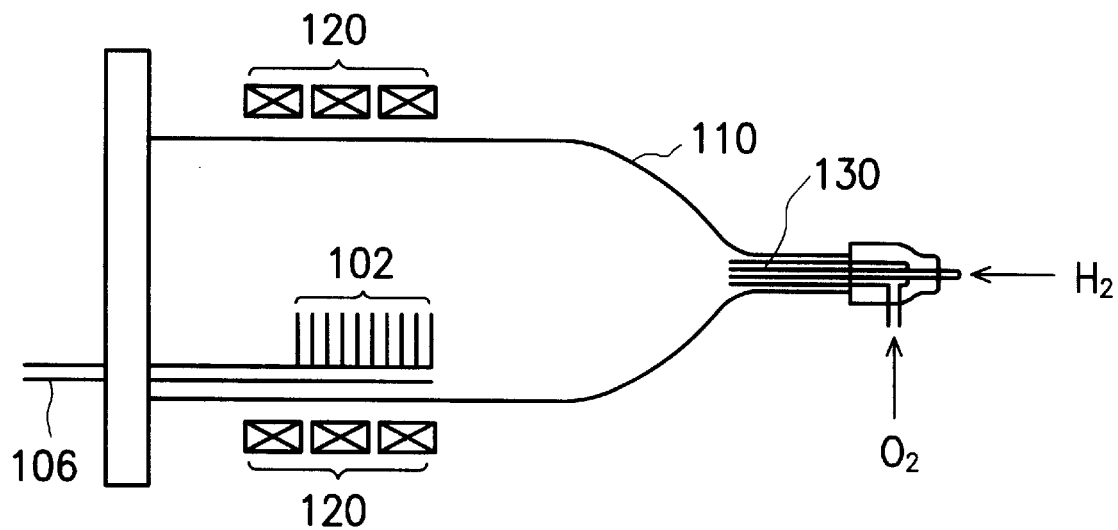
FIG. 1A shows a conventional horizontal type furnace.
Figure 1B:
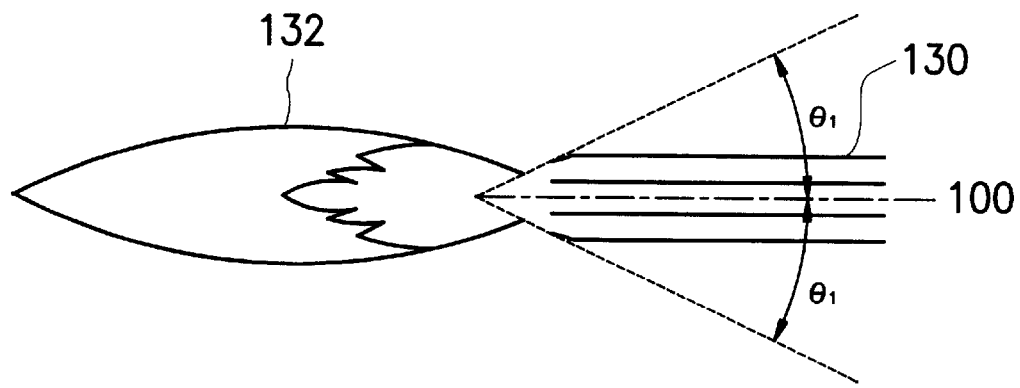
FIG. 1B schematically shows the gas intake of the furnace shown as FIG. 1A.
Figure 1C:
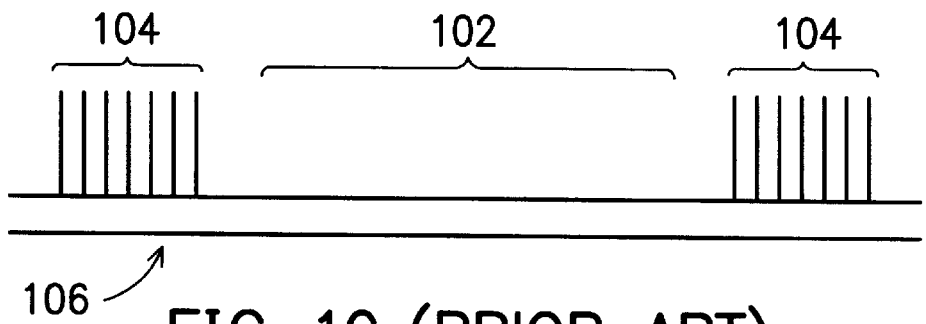
FIG. 1C shows a schematic drawing of the wafer boat shown in FIG. 1A and FIG. 1B.
Figure 2B:
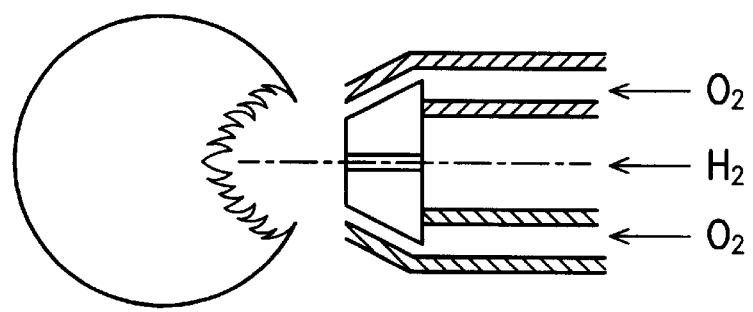
FIG. 2B shows an oxy-hydrogen flame produced by a gas flow injected by the wide angle gas injector.

In FIG. 2A, using an axis as a reference, the wide angle gas injector 220 has a nozzle 220a with a tilt angle $\theta_2$ along the reference axis. The mixture of gas comprises, for example, oxygen and hydrogen. While the hydrogen ignites, a high temperature oxy-hydrogen flame and high temperature water steam are produced. The nozzle 220a is manufactured using laser technique to control the tilt angle $\theta_2$ between about 30° to 60°. The tilt angle $\theta_2$ of the nozzle 220a is much larger than the tilt angle $\theta_1$ which is about 10° as shown in FIG. 1B. Compared to the conventional furnace, the oxy-hydrogen flame produced by the mixture of gas injected by the wide angle injector 220 has a very much reduced effective region. By precisely controlling the manufacturing condition of laser technique, while the tilt angle $\theta_2$ is about 45°, an oxy-hydrogen flame with an optimized effect is obtained. The oxy-hydrogen flame is shown as FIG. 2B.

As shown in FIG. 2A, the arrows illustrate the direction of the gas flow, for example, the high temperature water steam produced by the oxy-hydrogen flame or other gas product. The drafting apparatus 210 comprises a buffer board 212 having several gas intakes 212a in a front end of the drafting apparatus 210. Considering a wet oxidation process, the high temperature water steam produced by the mixture of gas injected by the wide angle injector 220 hit the buffer board 212 directly. By the effort of the buffer board 212, the water steam is buffed and retarded, and flow through the gas intakes 212a. The buffer board can be in any geometric shape, for example, a curved shape as shown, as long as the buffering effect is achieved.

A drafting region 214 is enclosed by the drafting apparatus 210. Flowing through the gas intakes 212a on the buffer board 212, the water steam is drafted by the drafting boards 214a disposed in the drafting region 214, and led to flow along the direction shown as the arrows to the laminar flow board 216 installed in a rear end of the drafting apparatus 210. The laminar flow board 216 can be in any geometric shape, for example, flat or curved, as long as the laminar flow effect is achieved.

The laminar flow board 216 comprises several outtakes 216a to transude the water steam being drafted through the drafting region 214. The water steam trasuded though the outtakes 216a thus has a single flowing direction to form a stable laminar flow. Therefore, the water steam arrives above the wafers with a uniform and even distribution. In this invention, by the installation of the drafting apparatus, the effective burning region of the oxy-hydrogen flame is isolated and reduced so as to reduce the space of the furnace. A uniform and even distributed water steam is provided above the wafers, the dummy wafers located carried aside of the wafer boat are not required. That is, the carrying capacity of the wafer boat is increased without the occupation of the dummy wafers. A thermal treatment can thus be performed on more wafers at a time. By the arrangement of the drafting apparatus 210, the wafer boat can be disposed as close to the high temperature water steam as required with wasting a large space. The capacity for disposing wafers is further enhanced, so that the throughput of products is highly enhanced. Moreover, in terms of safety and efficiency, the invention provides a furnace without the worry of putting the operators in danger. The furnace is thus more competitive in commerce.

It is appreciated that people skilled in the art may adapt this drafting apparatus into the application of a horizontal type, a vertical type, or other type of furnace.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A air flow apparatus used in a furnace, comprising:
   a buffer board, to buff and retard an injected gas mixture;
   a plurality of gas intakes on the buffer board, to intake the injected and buffed gas mixture;
   at least one drafting board, to draft and redirect the gas flow;
   a laminar flow board, to lead the gas flow into a single laminar flow; and
   a plurality of gas outtakes on the laminar flow board, to outtake the single laminar flow; wherein
   the drafting board is dispose in a drafting region between the buffer board and the laminar flow board.

2. The air flow apparatus of claim 1, wherein the buffer board is in a curved shape.

3. The air flow apparatus of claim 1, wherein the laminar flow board is in a flat shape.

4. A furnace for performing thermal treatment, comprising:
   a wide angle gas injector, to inject a mixture of gases into the furnace;
   a quartz tube, to ignite the injected mixture of gases into a flame and a steam;
   a heating element, disposed outside to heat a rear end of the quartz tube; wherein
   the wide angle gas injector has a tilt angle along a reference axis;

the quartz tube has a air flow apparatus, comprising:

- a buffer board, to buff and retard a gas injected by the wide angle gas injector, and the buffer board having a plurality of gas intakes;
- a drafting board, to draft and direct the injected gas flowing through the gas intakes;
- a laminar flow board, to direct the gas flow into a single flowing direction and to flow through a plurality of outtakes on the laminar flow board; and
- a wafer boat, to carrier wafers for performing thermal treatment by the laminar flow of gas through the outtakes.

5. The furnace of claim 4, wherein the mixture of gases comprises hydrogen and oxygen.

6. The furnace of claim 4, wherein the flame includes an oxy-hydrogen flame.

7. The furnace of claim 4, wherein the steam includes a water steam.

8. The furnace of claim 4, wherein the wide angle gas injector further comprises a nozzle for gas injection.

9. The furnace of claim 4, wherein the tilt angle is about 30° to 60°.

10. The furnace of claim 4, wherein the tilt angle is about 45°.

11. A thermal process, comprising:

input a gas mixture into a furnace through a wide angle injector thereof;

igniting the gas mixture to produce a flame and a water steam;

drafting the water steam by a air flow apparatus, so that a laminar flow of the water steam is obtained; and heating the furnace by a heating element, while a wafer boat carrying wafers is disposed in the furnace above the heating element, so that the laminar flow of the water steam is reacted with the wafers.

* * * * *